(12) United States Patent
Ueda et al.

(10) Patent No.: US 11,908,938 B2
(45) Date of Patent: Feb. 20, 2024

(54) SUBSTRATE PROCESSING LIQUID FOR ETCHING A METAL LAYER, SUBSTRATE PROCESSING METHOD AND SUBSTRATE PROCESSING APPARATUS

(71) Applicant: SCREEN Holdings Co., Ltd., Kyoto (JP)

(72) Inventors: Dai Ueda, Kyoto (JP); Yosuke Hanawa, Kyoto (JP)

(73) Assignee: SCREEN HOLDINGS CO., LTD. (JP)

(*) Notice: Subject to any disclaimer, the term of this patent is extended or adjusted under 35 U.S.C. 154(b) by 243 days.

(21) Appl. No.: 17/191,841

(22) Filed: Mar. 4, 2021

(65) Prior Publication Data

US 2021/0288172 A1 Sep. 16, 2021

(30) Foreign Application Priority Data

Mar. 11, 2020 (JP) .................. 2020-041546

(51) Int. Cl.
*H01L 29/78* (2006.01)
*H01L 29/66* (2006.01)
(Continued)

(52) U.S. Cl.
CPC ............ *H01L 29/785* (2013.01); *C23F 1/26* (2013.01); *C23F 1/32* (2013.01); *C23F 1/38* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 10,490,417 B2 * 11/2019 Dory .................... C23F 1/00
11,499,099 B2 * 11/2022 Takahashi ............ C09K 13/00
(Continued)

FOREIGN PATENT DOCUMENTS

JP 2007-294625 A 11/2007
JP 2008-006553 A 1/2008
(Continued)

OTHER PUBLICATIONS

Korean Office Action dated Jul. 20, 2022 for corresponding Korean Patent Application No. 10-2021-0031297.
(Continued)

*Primary Examiner* — Younes Boulghassoul
(74) *Attorney, Agent, or Firm* — OSTROLENK FABER LLP

(57) ABSTRACT

A substrate processing liquid is used to etch a substrate in which at least either a bottom wall or a side wall forming a trench structure is an etched layer made of metal or a metal compound. The substrate processing liquid includes a chemical liquid containing $H_2O_2$ molecules or $HO_2^-$ functioning as an etchant for etching the metal, and a complex forming agent containing $NH_4^+$ and forming a complex with ions of the metal and is adjusted to a pH of 5 or more.

13 Claims, 8 Drawing Sheets

(51) Int. Cl.
*H01L 21/306* (2006.01)
*H01L 21/67* (2006.01)
*C23F 1/26* (2006.01)
*C23F 1/38* (2006.01)
*H01L 21/3213* (2006.01)
*C23F 1/32* (2006.01)
*H01L 21/28* (2006.01)
*H01L 29/49* (2006.01)
*H01L 21/8234* (2006.01)

(52) U.S. Cl.
CPC .. *H01L 21/30604* (2013.01); *H01L 21/32134* (2013.01); *H01L 21/6708* (2013.01); *H01L 21/67028* (2013.01); *H01L 29/66795* (2013.01); *H01L 21/28088* (2013.01); *H01L 21/823437* (2013.01); *H01L 29/4966* (2013.01)

(58) Field of Classification Search
CPC ........... H01L 27/1211; H01L 27/10826; H01L 27/10879; H01L 29/41791; H01L 29/66795–66818; H01L 29/785–7856; H01L 2029/7857–7858; H01L 2924/13067; H01L 21/28088; H01L 21/823437; H01L 21/823828; H01L 29/4966; H01L 21/32134; H01L 21/30604; H01L 21/30608; H01L 21/6708; H01L 21/67075; C23F 1/26; C23F 1/38
See application file for complete search history.

(56) References Cited

U.S. PATENT DOCUMENTS

| | | | |
|---|---|---|---|
| 2005/0250339 | A1 | 11/2005 | Shea et al. .................... 438/745 |
| 2008/0003770 | A1 | 1/2008 | Enomoto et al. ............. 438/411 |
| 2013/0200040 | A1* | 8/2013 | Fitzsimmons .... H01L 21/76814 216/17 |
| 2013/0203231 | A1* | 8/2013 | Fitzsimmons ............ C23F 1/40 438/585 |
| 2016/0056054 | A1 | 2/2016 | Takahashi et al. |
| 2016/0257880 | A1* | 9/2016 | Hong ................ H01L 21/32134 |
| 2018/0148645 | A1* | 5/2018 | Lee ........................ C09K 13/04 |
| 2019/0085241 | A1* | 3/2019 | Liu .................... H01L 21/30604 |
| 2019/0096721 | A1* | 3/2019 | Iwasaki ............. H01L 21/67253 |
| 2019/0338186 | A1 | 11/2019 | Lee et al. |
| 2021/0238478 | A1* | 8/2021 | Lee ................. H01L 21/823462 |
| 2022/0340814 | A1* | 10/2022 | Takahashi ............ C09K 15/322 |

FOREIGN PATENT DOCUMENTS

| | | |
|---|---|---|
| JP | 2015-536581 A | 12/2015 |
| KR | 10-2011-0009834 A | 1/2011 |
| KR | 10-2015-0140338 A | 12/2015 |
| KR | 10-2018-0060489 A | 6/2018 |
| WO | WO 2014/089438 A9 | 6/2014 |

OTHER PUBLICATIONS

Office Action dated Jan. 18, 2023 for the corresponding Korean Patent Application No. 10-2021-0031297 with English translation.
Korean Notice of Allowance dated Jul. 16, 2023 in corresponding Korean Patent Application No. 10-2021-0031297.
Japanese Office Action dated Oct. 3, 2023 in corresponding Japanese Patent Application No. 2020-041546. Machine translation attached.

* cited by examiner

SUBSTRATE PROCESSING LIQUID FOR ETCHING A METAL LAYER, SUBSTRATE PROCESSING METHOD AND SUBSTRATE PROCESSING APPARATUS

CROSS REFERENCE TO RELATED APPLICATION

Contents disclosed in the specification, drawings and claims of the following Japanese Patent Application are all incorporated herein by reference.

Japanese Patent Application No. 2020-041546 (filed on Mar. 11, 2020)

BACKGROUND OF THE INVENTION

Field of the Invention

This invention relates to a substrate processing liquid for applying an etching process to a substrate having a trench structure and a substrate processing method and a substrate processing apparatus for processing a substrate using the substrate processing liquid.

Description of the Related Art

A manufacturing process of an electronic device such as a semiconductor device or a liquid crystal display device includes an etching process of forming a desired pattern by partially removing a substrate by etching. For example, JP 2015-536581A describes a manufacturing process of a field effect transistor having fins (hereinafter, referred to as a "FinFET"). In this FinFET, a gate is formed to straddle over a plurality of fins. Specifically, a gate material layer is formed, following the formation of a HKMG layer on the plurality of fins. Out of these layers, the HKMG layer is formed by laminating a high-k metal gate layer (HK) made of a high-k dielectric such as $HfO_2$, $Al_2O_3$ or $La_2O_3$ and a metal layer (MG) made of TiN, TaN, TaAlN or TiC. RIE (reactive ion etching) is used to pattern the HKGM layer in JP 2015-536581A.

SUMMARY OF THE INVENTION

In recent years, it has been studied to use wet etching in manufacturing electronic components such as FinFETs described above and three-dimensional NAND-type non-volatile semiconductor devices (hereinafter, referred to as "3D-NAND memories"). However, in these electronic components, it has become necessary to apply an etching process to narrow regions as patterns become finer and three-dimensional structures become more complicated. For example, to form a metal layer of a FinFET, it is necessary to form a TiN layer using a material constituting the metal layer, e.g. TiN, on fins as shown in FIG. 1 to be described later and finish this TiN layer into a desired shape by partially removing the TiN layer by an etching liquid. The TiN layer formed over the plurality of fins has a trench structure. Accordingly, to finish the TiN layer into the desired shape, an etchant for etching the TiN layer needs to infiltrate into the trench structure. However, as a fin pitch of the FinFET becomes narrower, openings of the trench structure become narrower and the insides of the trench structure become narrow spaces. Thus, it is difficult to efficiently infiltrate the etchant and an etching rate in the narrow spaces is reduced. As a result, there has been a problem that the metal layer cannot be finished into the desired shape. Such a problem is not limited to a case where a bottom wall and all of one or more side walls extending toward the opening from the bottom wall, the walls constituting the trench structure, as in the FinFET are to be etched, but also occurs when only the bottom wall or all or some of side walls are to be etched.

This invention was developed in view of the above problem and aims to provide a substrate processing liquid, a substrate processing method and a substrate processing apparatus capable of applying an etching process at an excellent etching rate to a substrate in which at least either a bottom wall or side wall forming a trench structure serves as an etched layer made of metal or a compound of this metal.

A first aspect of the invention is a substrate processing liquid for removing an etched layer by being supplied to a substrate having a trench structure in which a narrow space is formed by an opening having a narrow width, a bottom wall facing the opening and one or more side walls extending toward the opening and at least either the bottom wall or the side wall is formed by the etched layer made of metal or a metal compound. The substrate processing liquid comprises: a chemical liquid containing $H_2O_2$ molecules or $HO_2^-$ functioning as an etchant for etching the metal; and a complex forming agent containing $NH_4^+$ and forming a complex with ions of the metal, wherein a pH is adjusted to 5 or more.

A second aspect of the invention is a substrate processing method, comprising: removing an etched layer by supplying a substrate processing liquid to a substrate having a trench structure in which a narrow space is formed by an opening having a narrow width, a bottom wall facing the opening and one or more side walls extending toward the opening and at least either the bottom wall or the side wall is formed by the etched layer made of metal or a metal compound; and stopping the removal of the etched layer by removing the substrate processing liquid from the substrate, wherein: the substrate processing liquid includes a chemical liquid containing $H_2O_2$ molecules or $HO_2^-$ functioning as an etchant for etching the metal and a complex forming agent containing $NH_4^+$ and forming a complex with ions of the metal; and the substrate processing liquid is adjusted to a pH of 5 or more.

A third aspect of the invention is a substrate processing apparatus, comprising: a substrate holder that holds a substrate having a trench structure in which a narrow space is formed by an opening having a narrow width, a bottom wall facing the opening and one or more side walls extending toward the opening and at least either the bottom wall or the side wall is formed by an etched layer made of metal or a metal compound; and a processing liquid supplier that supplies a substrate processing liquid to the substrate held by the substrate holder, wherein: the substrate processing liquid includes a chemical liquid containing $H_2O_2$ molecules or $HO_2^-$ functioning as an etchant for etching the metal and a complex forming agent containing $NH_4^+$ and forming a complex with ions of the metal; and the substrate processing liquid is adjusted to a pH of 5 or more.

According to the invention thus configured, the etched layer is etched using the substrate processing liquid including the chemical liquid containing $H_2O_2$ molecules or $HO_2^-$ functioning as the etchant for etching the metal and the complex forming agent containing $NH_4^+$ and forming a complex with ions of the metal and adjusted to a pH of 5 or more. Thus, an etching process can be applied at an excellent etching rate to the substrate in which at least either the bottom or the side wall forming the trench structure is the etched layer made of metal or a compound of this metal.

All of a plurality of constituent elements of each aspect of the invention described above are not essential and some of the plurality of constituent elements can be appropriately changed, deleted, replaced by other new constituent elements or have limited contents partially deleted in order to solve some or all of the aforementioned problems or to achieve some or all of effects described in this specification. Further, some or all of technical features included in one aspect of the invention described above can be combined with some or all of technical features included in another aspect of the invention described above to obtain one independent form of the invention in order to solve some or all of the aforementioned problems or to achieve some or all of the effects described in this specification.

DETAILED DESCRIPTION OF THE PREFERRED EMBODIMENTS

Summary of Invention

The invention relates to a substrate processing method and a substrate processing apparatus for finishing a substrate into a desired shape by applying wet etching to an etched layer, which is at least one of a bottom wall and side walls of a trench structure formed in the substrate, by supplying a substrate processing liquid, and the substrate processing liquid for effectively performing the etching. Particularly, in the substrate processing method according to the invention, the etched layer is made of metal or a metal compound, and the etching process is performed using a chemical liquid containing $H_2O_2$ molecules or $HO_2^-$ functioning as an etchant for etching the metal. A hydrogen peroxide aqueous solution can be, for example, used as this chemical liquid. Further, the substrate processing method is applicable to a process of manufacturing a gate of a FinFET, for example, as shown in FIG. 1.

Figure 1:
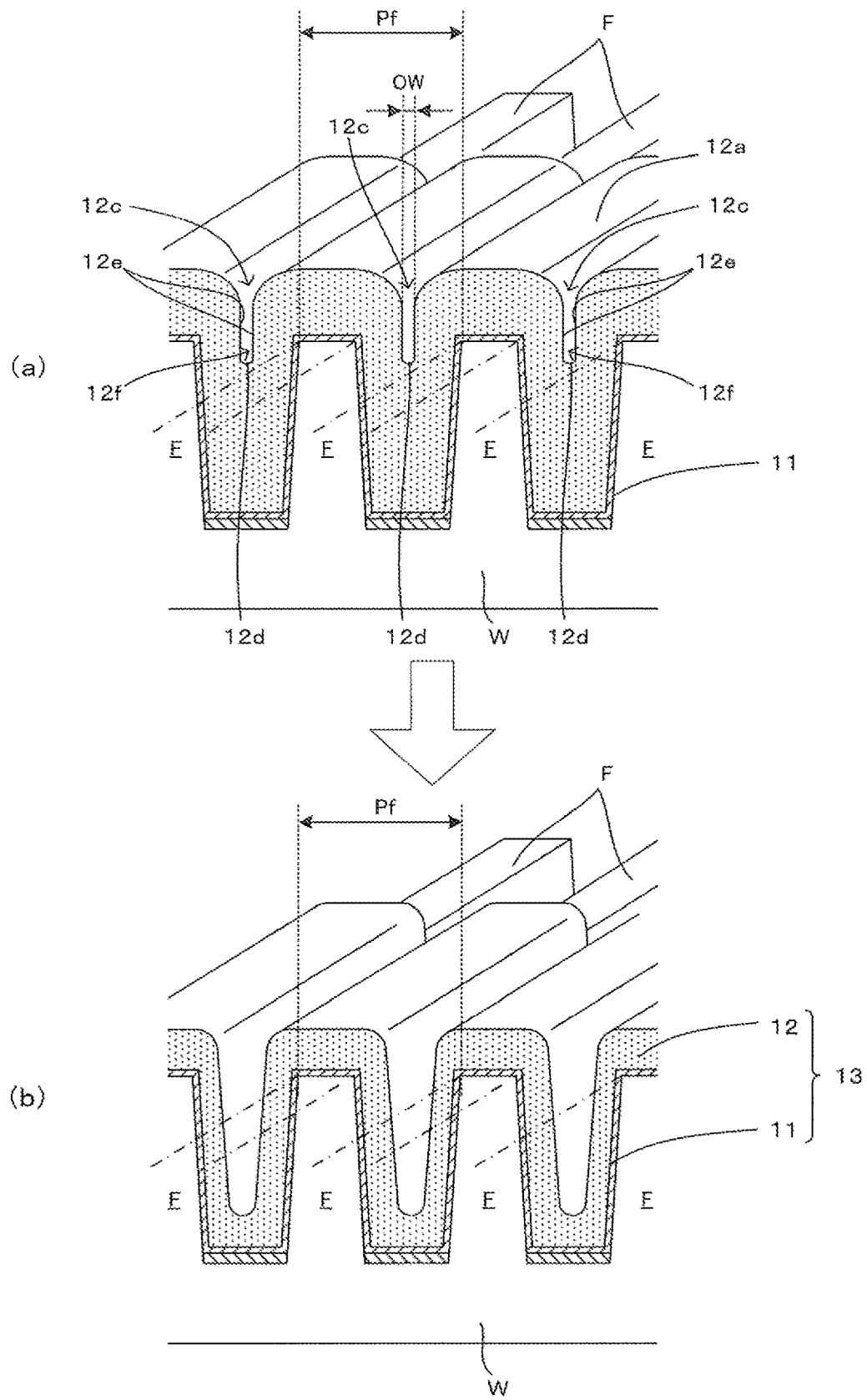
FIG. 1 is views schematically showing one embodiment of the substrate processing method according to the invention.

FIG. 1 is views schematically showing one embodiment of the substrate processing method according to the invention. In manufacturing the gate of the FinFET, a metal layer 12 of TiN, TaN, TaAlN, TiC or the like is laminated to have a desired thickness on a high-k dielectric layer 11 formed to straddle over a plurality of fins F standing upward from a substrate W made of silicon or the like as described in JP 2015-536581A (see (b) in a lower stage of FIG. 1). A HKMG layer 13 is constituted by these high-k dielectric layer 11 and metal layer 12. Then, a gate material layer (not shown) made of polysilicon is formed on the HKMG layer. In this way, the manufacturing of the gate of the FinFET is completed.

Here, the metal layer 12 is formed in two stages. That is, as shown in (a) in an upper stage of FIG. 1, a thick metal layer thicker than the desired thickness, e.g. a TiN layer 12a, is formed on the high-k dielectric layer 11 by metal vapor deposition or the like. After this TiN layer 12a is formed, wet etching is applied to the TiN layer 12a to form the metal layer 12 of the desired thickness as shown in (b) in the lower stage of FIG. 1 by supplying a substrate processing liquid to a surface of the substrate W.

What should be noted here is that the TiN layer 12a is formed along the shapes of the fins F and a trench structure narrow between adjacent ones of the fins F is formed. Since the TiN layer 12a is relatively thick, openings 12c of the trench structure are considerably smaller than a fin pitch Pf. That is, an opening dimension OW of the openings 12c is narrow. Further, bottom walls 12d and side walls 12e forming the trench structure also have the following feature. The bottom wall 12d facing the opening 12c is narrow and an interval between the side walls 12e extending from the bottom wall 12d toward the opening 12c is equal to or smaller than the opening dimension OW. Accordingly, internal spaces of the trench structure are considerably narrower than spaces formed by the fins F adjacent to each other and serve as narrow spaces 12f. Thus, it is difficult to efficiently infiltrate the etchant into the narrow spaces 12f even if the substrate processing liquid mainly containing the hydrogen peroxide aqueous solution is merely used. As a result, a reduction in the etching rate of the TiN layer 12a constituting the bottom walls 12d and the side walls 12e of the trench structure is unavoidable.

Figure 8:
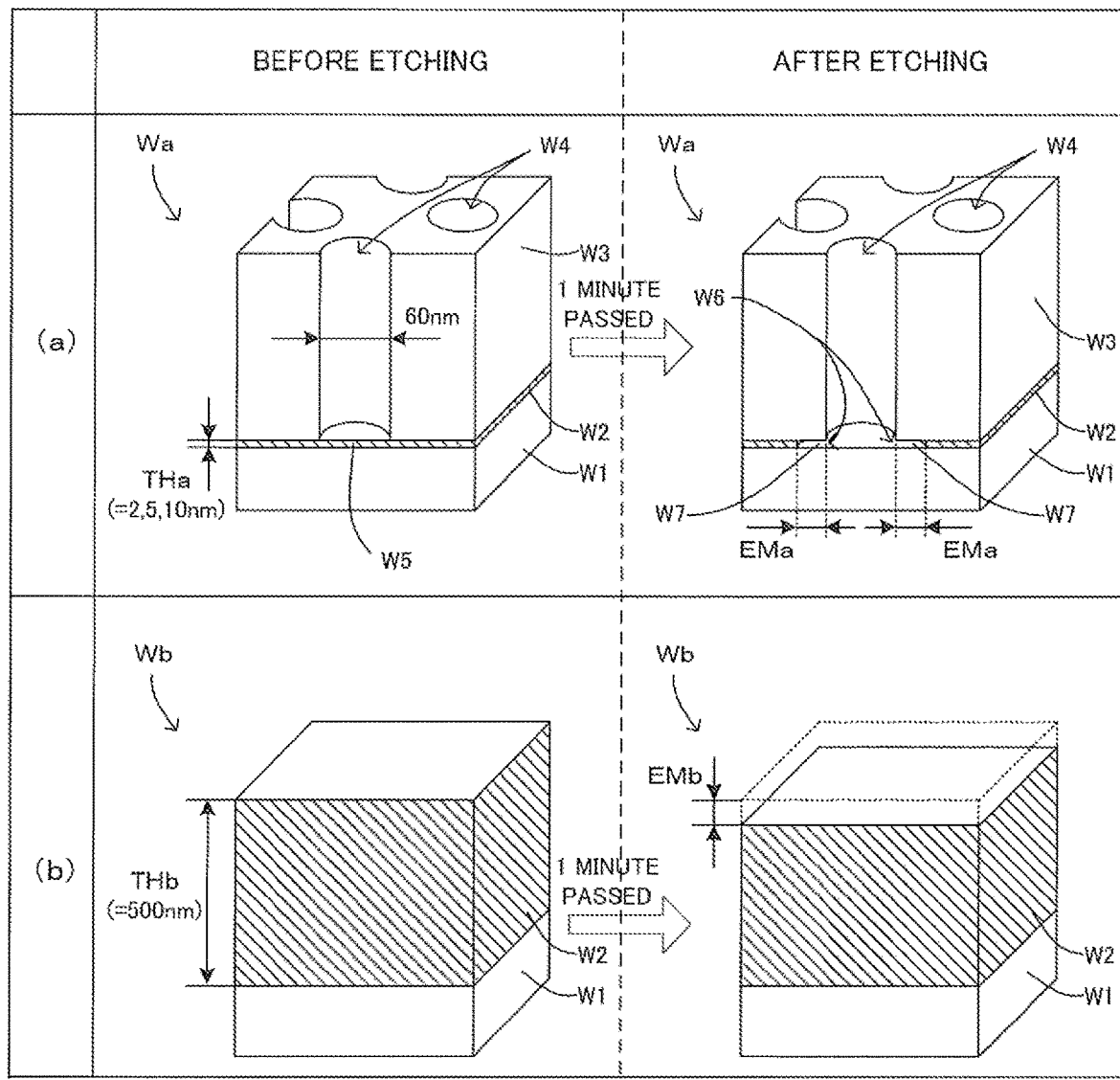
FIG. 8 is a diagram schematically showing the configuration of an evaluation sample for the etching rate and experiment contents.

Accordingly, the inventors of the invention diligently researched and obtained two knowledges. The first knowledge is that the addition of a complex forming agent containing complex forming ions to the substrate processing liquid is effective to promote the formation of a complex, in other words, to promote the dissolution of an etched layer, in the narrow spaces 12f. For example, a complex of Ti is formed by $NH_4^+$. Further, if parts of wall surfaces forming the trench structure are made of Si, $SiO_2$ or the like, for example, as shown in FIG. 8 to be described later, the wall surfaces are easily charged to a negative potential. In this case, to maintain electrical neutrality in the trench structure, $NH_4^+$, which is cations, is thought to easily infiltrate into the trench structure, i.e. into the narrow spaces and be concentrated. Thus, if the complex forming agent for forming a complex with the TiN layer 12a is added to the substrate processing liquid, the formation of the complex in the narrow spaces 12f is promoted, i.e. the dissolution of the etched layer is promoted.

Ammonium salts containing ammonium ions $NH_4^+$ and expressed by a general formula:

$$(NH_4^+)_n X^{n-}$$

where $X^{n-}$ denotes n-valent anions and n is 1 or 2, can be used as the complex forming agent suitable in manufacturing the gate of the FinFET. Ammonium salts include:

NH$_4$F (Ammonium Fluoride),
NH$_4$Cl (Ammonium Chloride),
NH$_4$Br (Ammonium Bromide),
NH$_4$I (Ammonium Iodide),
(NH$_4$)$_2$SO$_4$ (Ammonium Sulfide),
NH$_4$CH$_3$CO$_2$ (Ammonium Acetate), and
(NH$_4$)$_2$PO$_4$ (Ammonium Phosphate).

Further, alkyl ammonium salts can be used as the complex forming agent. Alkyl ammonium salts include quaternary ammonium salts expressed by a general formula of $(NR4^+)_n X^{n-}$, tertiary amines expressed by a general formula of R3N, secondary amines expressed by a general formula of R2NH, primary amines expressed by a general formula of RNH2 (R is an alkyl group or aryl group) and contain, for example, halides, hydrosulfates such as tetrabutylammonium hydrosulfate, acetates such as tetramethylammonium acetate, hydroxides such as tetraethylammonium hydroxide and perchloric acids such as tetrabutylammonium perchlorate, including:

[(CH$_3$)$_4$N]F (TetraMethylAmmonium Fluoride; TMAF),
[(CH$_3$CH$_2$CH$_2$)$_4$N]F (TetraEthylAmmonium Fluoride; TEAF),
[(CH$_3$CH$_2$CH$_2$CH$_2$CH$_2$)$_4$N]F (TetraButhylAmmonium Fluoride; TBAF),
[(CH$_3$)$_4$N]C$_1$ (TetraMethylAmmonium Chloride; TMAC),
[(CH$_3$CH$_2$CH$_2$)$_4$N]C$_1$ (TetraEthylAmmonium Chloride; TEAC),
[(CH$_3$CH$_2$CH$_2$CH$_2$CH$_2$)$_4$N]C$_1$ (TetraButhylAmmonium Chloride; TBAC),
[(CH$_3$)$_4$N]I (TetraMethylAmmonium Iodide; TMAI),
[(CH$_3$CH$_2$CH$_2$)$_4$N]I (TetraEthylAmmonium Iodide; TEAI), and
[(CH$_3$CH$_2$CH$_2$CH$_2$CH$_2$)$_4$N]I (TetraButylAmmonium Iodide; TBAI).

Further, general chelating agents can also be used as the complex forming agent. For example, ethylenediaminetetraacetic acid (EDTA), calcium sodium edetate hydrate, glycoletherdiaminetetraacetic acid (EGTA), hydroxyethyliminodiacetic acid (HIDA), iminodiacetic acid (IDA), nitrilotriacetic acid (NTA), nitrilotris(methylphosphonic acid) sodium salt (NTPO), triethylenetetramine hexaacetic acid (TTHA) can be used as the chelating agents.

Further, the second knowledge is that the concentration of the etchant (hereinafter, referred to as an "etchant concentration") is easily affected by pH in the substrate processing liquid. For example, an etching model of titanium (Ti) as a main constituent of the metal layer 12 is as follows as conventionally known.

[Formula 1]

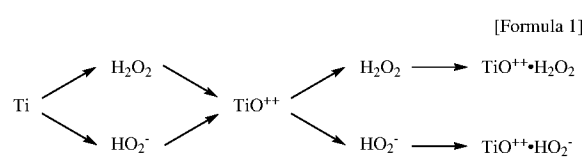

As is clear from this model, an etchant such as H$_2$O$_2$ molecules themselves or HO$_2^-$ dissociated from H$_2$O$_2$ contributes to the etching of the metal layer 12. However, the concentration of the etchant is reduced due to the influence of an electric double layer produced near the surface of the etched layer in the narrow spaces 12$f$, which is thought to be one of main causes reducing the etching rate. Here, a dissociation constant of HO$_2^-$ ions is defined by the following formula.

$$HO_2^- + H^+ \rightleftarrows H_2O_2, K = \frac{[HO_2^-][H^+]}{[H_2O_2]} (\text{at } 20° \text{ C. } 1.2 \times 10^{-12})$$ [Formula 2]

When a pH control of the substrate processing liquid was studied based on this, it was found that the etching rate was extremely low in an acid-to-neutral region and the etchant concentration in the substrate processing liquid increased with an increase in pH. Accordingly, to increase the etching rate in the narrow spaces 12$f$, it is important to adjust the pH of the substrate processing liquid to 5 or more and increase the etching concentration. However, if the pH is too high, selectivity may not be achieved by etching substances (Si, SiO$_2$, etc.) other than the metal layer 12. In view of this point, it is desirable to suppress the pH of the substrate processing liquid to 9 or less. That is, the etchant concentration in the substrate processing liquid can be increased by adjusting the pH of the substrate processing liquid to 5 or more to increase the etching rate and selectivity can also be simultaneously ensured by suppressing the pH to 9 or less.

The pH of a mixture liquid obtained by mixing a hydrogen peroxide aqueous solution and DIW (deionized water) at a ratio of 1:5 is about 5. If an ammonium salt or alkylammonium salt is added as a complex forming agent to this, the pH increases. Here, to further increase the pH of the substrate processing liquid, an alkaline pH adjuster may be further added. Examples of the alkaline pH adjuster include:

NH$_4$OH (Ammonium Hydroxide),
NaOH (Sodium Hydroxide), and
KOH (Potassium Hydroxide), and at least one of these can be used. On the other hand, if the pH of the substrate processing liquid becomes excessively higher than a desired value by the addition of the complex forming agent, an acid pH adjuster may be further added on the premise of keeping the pH at 5 or more. Examples of the acid pH adjuster include:

HCl (Hydrochloric Acid),
H$_2$SO$_4$ (Sulfuric Acid),
HNO$_3$ (Nitric Acid), and
H$_3$PO$_4$ (Phosphoric Acid), and at least one of these can be used.

As described above, in manufacturing the HKMG layer 13 of the FinFET, a chemical liquid containing an etchant such as H$_2$O$_2$ molecules or HO$_2^-$ can be used as the substrate processing liquid for etching the TiN layer 12$a$ constituting the bottom walls 12$d$ and the side walls 12$e$ of the trench structure, but the addition of the complex forming agent and the pH adjustment are preferable. That is, by adding the complex forming agent and adjusting the pH of the substrate processing liquid to 5 or more, the amount of the etchant can be increased and the etchant can be efficiently infiltrated into the trench structure, i.e. narrow spaces 12$f$. Thus, the etching process can be applied at an excellent etching rate to the TiN layer 12$a$ (etched layer) constituting the bottom walls 12$d$ and the side walls 12$e$. As a result, the high-performance FinFET can be manufactured.

Further, by further adding the pH adjuster to the substrate processing liquid, the pH of the substrate processing liquid can be adjusted to a desired value and the etching process can be stably performed.

<Substrate Processing Apparatus>

Next, the configuration and operation of the substrate processing apparatus for performing the substrate processing method shown in FIG. 1 using the above substrate processing liquid are described with reference to FIGS. 2 to 7.

Figure 2:
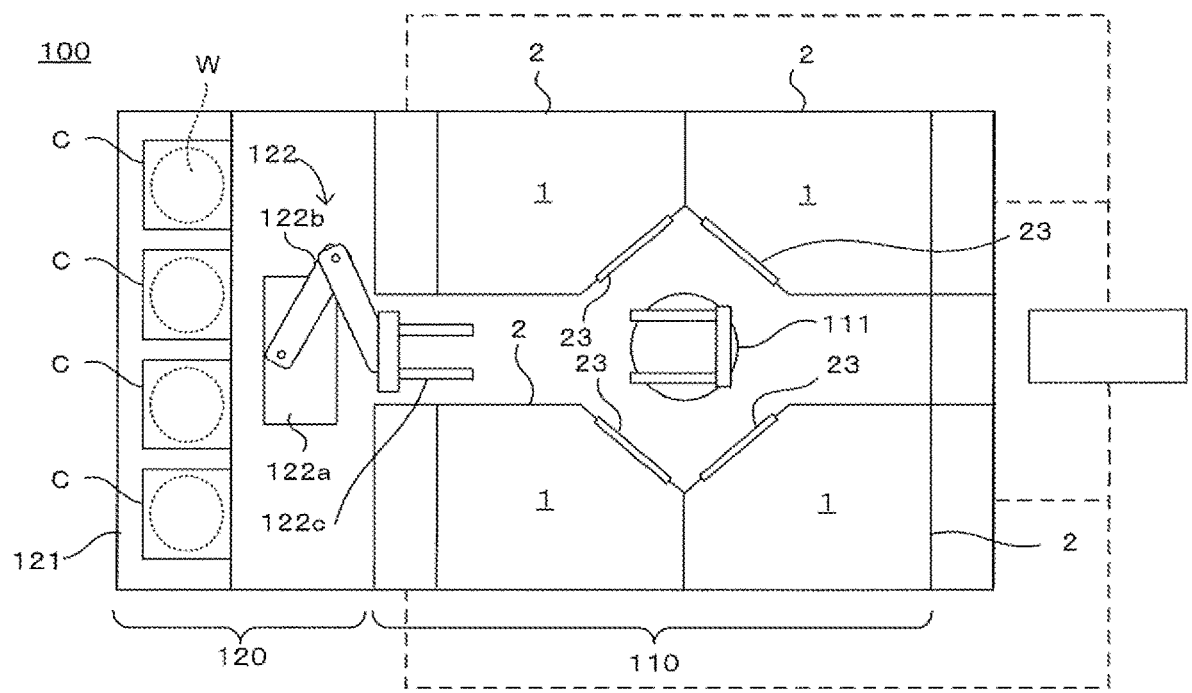
FIG. 2 is a diagram showing a first embodiment of the substrate processing apparatus capable of performing the substrate processing method shown in FIG. 1.
Figure 3:
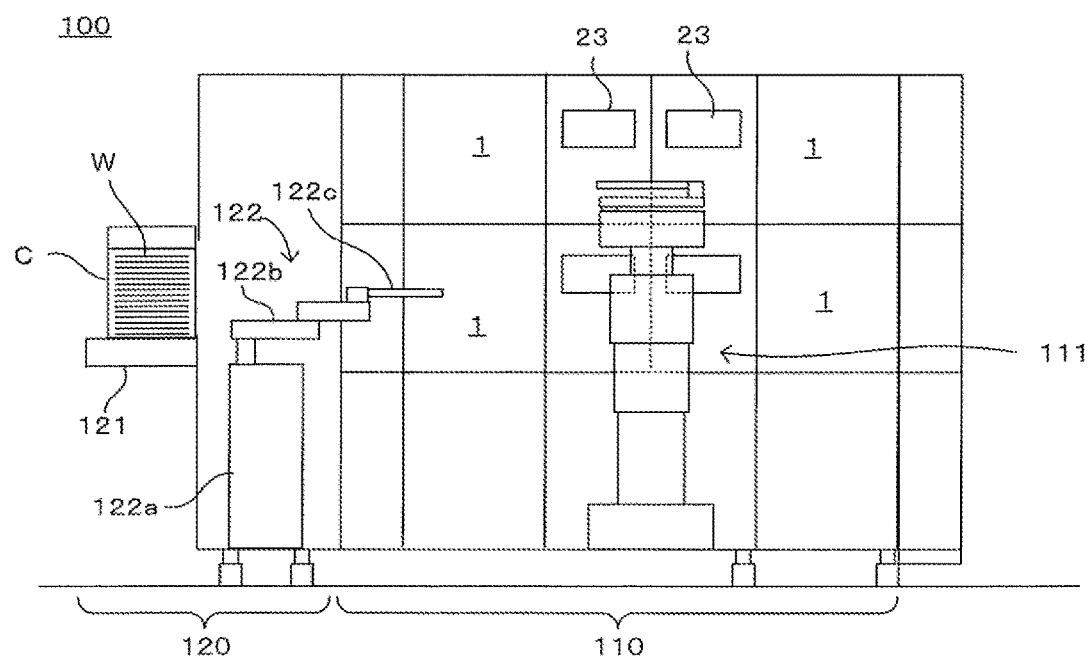
FIG. 3 is a side view of the substrate processing apparatus shown in FIG. 2.

FIG. 2 is a diagram showing a first embodiment of the substrate processing apparatus capable of performing the substrate processing method shown in FIG. 1. Further, FIG. 3 is a side view of the substrate processing apparatus shown in FIG. 2. This substrate processing apparatus 100 is an apparatus for performing the etching process to a substrate W shown in the upper stage of FIG. 1 using the substrate processing liquid. These figures are schematic diagrams not showing the appearance of the apparatus, but easily showing the internal structure of the substrate processing apparatus 100 by excluding outer wall panels and other partial configurations of the apparatus. This substrate processing apparatus 100 is a single-wafer type apparatus installed, for example, in a clean room for forming a metal layer (reference sign 12 in FIG. 1) of a HKMG layer by applying the etching process to the substrate W for manufacturing the FinFET.

In this embodiment, to form the metal layer 12 by etching the TiN layer 12a in the upper stage of FIG. 1, a substrate processing liquid obtained by adding 1 mM (where M=1 mol/L) of ammonium chloride as a complex forming agent to a mixture liquid obtained by mixing a hydrogen peroxide aqueous solution (chemical liquid) containing an etchant, DIW and an ammonium hydroxide aqueous solution as a pH adjuster at a ratio of 1:5:0.01 is used as an etching liquid. The pH of the substrate processing liquid prepared in this way is approximately 9. Note that this substrate processing liquid is equivalent to "Example 2" to be described later, but other substrate processing liquids such as those shown in "Example 1" and "Example 3" may be used.

As shown in FIG. 2, the substrate processing apparatus 100 includes a substrate processing station 110 for processing the substrate W and an indexer station 120 coupled to this substrate processing station 110. The indexer station 120 includes a container holder 121 capable of holding a plurality of containers C for housing the substrates W (FOUPs (Front Opening Unified Pods), SMIF (Standard Mechanical Interface) pods, OCs (Open Cassettes) for housing a plurality of the substrates W in a sealed state), and an indexer robot 122 for taking out an unprocessed substrate W from the container C by accessing the container C held by the container holder 121 and housing a processed substrate W in the container C. A plurality of the substrates W are housed substantially in a horizontal posture in each container C.

The indexer robot 122 includes a base 122a fixed to an apparatus housing, an articulated arm 122b provided rotatably about a vertical axis with respect to the base 122a, and a hand 122c mounted on the tip of the articulated arm 122b. The hand 122c is structured such that the substrate W can be placed and held on the upper surface thereof. Such an indexer robot including the articulated arm and the hand for holding the substrate is not described in detail since being known.

The substrate processing station 110 includes a substrate conveyor robot 111 arranged substantially in a center in a plan view and a plurality of processing units 1 arranged to surround this substrate conveyor robot 11. Specifically, the plurality of (eight in this example) processing units 1 are arranged to face a space where the substrate conveyor robot 111 is arranged. The substrate conveyor robot 111 randomly accesses these processing units 1 and transfers the substrates W. On the other hand, each processing unit 1 performs a predetermined processing to the substrate W. In this embodiment, these processing units 1 have the same function. Thus, a plurality of the substrates W can be processed in parallel.

Figure 4:
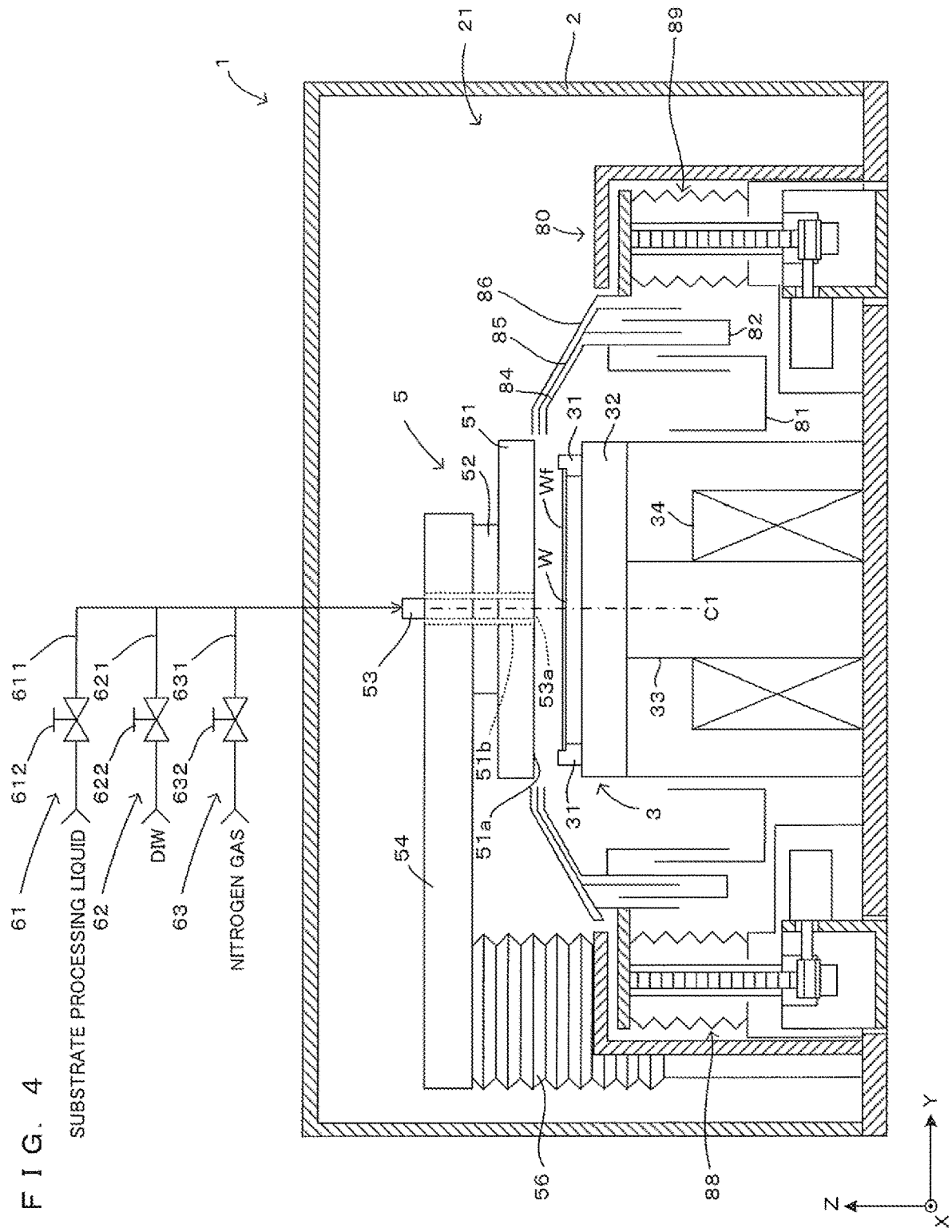
FIG. 4 is a partial sectional view showing the configuration of the processing unit.
Figure 5:
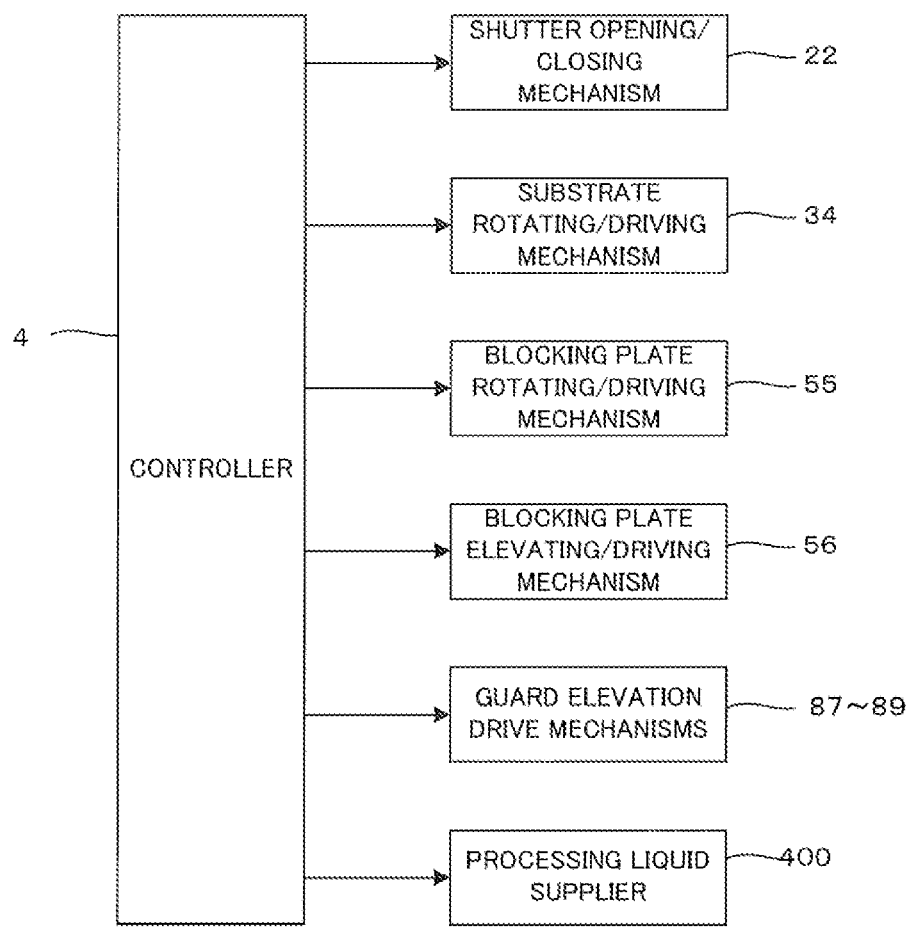
FIG. 5 is a block diagram showing an electrical configuration of a controller for controlling the processing unit.

FIG. 4 is a partial sectional view showing the configuration of the processing unit. FIG. 5 is a block diagram showing an electrical configuration of a controller for controlling the processing unit. Note that although a controller 4 is provided for each processing unit 1 in this embodiment, the plurality of processing units 1 may be controlled by one controller. Further, the processing units 1 may be controlled by a control unit (not shown) for controlling the entire substrate processing apparatus 100.

The processing unit 1 includes a chamber 2 having an internal space 21 and a spin chuck 3 functioning as a substrate holder housed in the internal space 21 of the chamber 2 to hold the substrate W. As shown in FIGS. 1 and 2, a shutter 23 is provided on a side surface of the chamber 2. A shutter opening/closing mechanism 22 (FIG. 4) is connected to the shutter 23, and the shutter 23 is opened/closed in response to an open/close command from the controller 4. More specifically, in the processing unit 1, the shutter opening/closing mechanism 22 opens the shutter 23 when an unprocessed substrate W is carried into the chamber 2, and the unprocessed substrate W is carried to the spin chuck 3 in a face-up state by the hand of the substrate conveyor robot 111. That is, the substrate W is placed on the spin chuck 3 with the TiN layer 12a (see FIG. 1) faced up. If the hand of the substrate conveyor robot 111 is retracted from the chamber 2 after the substrate is carried in, the shutter opening/closing mechanism 22 closes the shutter 23. Then, a desired substrate processing is performed in a normal temperature environment by supplying a substrate processing liquid, DIW (deionized water) and a nitrogen gas to the front surface Wf of the substrate W as described later in the internal space 21 of the chamber 2. Further, after the substrate processing is finished, the shutter opening/closing mechanism 22 opens the shutter 23 again and the hand of the substrate conveyor robot 111 carries out the processed substrate W from the spin chuck 3. As just described, in this embodiment, the internal space 21 of the chamber 2 functions as a processing space in which the substrate processing is performed while the normal temperature environment is maintained. Note that the "normal temperature" means a temperature range of 5° C. to 35° C. in this specification.

The spin chuck 3 includes a plurality of chuck pins 31 for holding the substrate W, a spin base 32 formed into a disk shape along a horizontal direction to support the plurality of chuck pins 31, a center shaft 33 provided rotatably about an axis of rotation C1 parallel to a surface normal extending from a center of the front surface of the substrate W while being coupled to the spin base 32, and a substrate rotating/driving mechanism 34 for rotating the center shaft 33 about the axis of rotation C1 by a motor. The plurality of chuck pins 31 are provided on a peripheral edge part of the upper surface of the spin base 32. In this embodiment, the chuck pins 31 are arranged at equal intervals in a circumferential direction. If the motor of the substrate rotating/driving mechanism 34 operates in response to a rotation command from the controller 4 with the substrate W placed on the spin chuck 3 held by the chuck pins 31, the substrate W rotates about the axis of rotation C1. Further, the substrate processing liquid, the DIW and a nitrogen gas are successively supplied to the front surface Wf of the substrate W from a nozzle provided in an atmosphere blocking mechanism 5 in response to a supply command from the controller 4.

The atmosphere blocking mechanism 5 includes a blocking plate 51, an upper spin shaft 52 provided to be integrally rotatable with the blocking plate 51 and a nozzle 53 penetrating in a vertical direction through a central part of the blocking plate 51. The blocking plate 51 is finished into a disk shape having a diameter substantially equal to or larger than that of the substrate W. The blocking plate 51 is arranged to face the upper surface of the substrate W held by the spin chuck 3 while being spaced apart. Thus, the lower surface of the blocking plate 51 functions as a circular substrate facing surface 51a facing the entire front surface Wf of the substrate W. Further, a hollow cylindrical through hole 51b penetrating in the vertical direction through the blocking plate 51 is formed in a central part of the substrate facing surface 51a.

The upper spin shaft 52 is provided rotatably about an axis of rotation (axis coinciding with the axis of rotation C1 of the substrate W) vertically extending through a center of the blocking plate 51. The upper spin shaft 52 has a hollow cylindrical shape. The inner peripheral surface of the upper spin shaft 52 is formed into a cylindrical surface centered on the above axis of rotation. An internal space of the upper spin shaft 52 communicates with the through hole 51b of the blocking plate 51. The upper spin shaft 52 is supported relatively rotatably on a support arm 54 horizontally extending above the blocking plate 51.

The nozzle 53 is arranged above the spin chuck 3. The nozzle 53 is supported by the support arm 54 in a state unrotatable with respect to the support arm 54. Further, the nozzle 53 is movable upward and downward integrally with the blocking plate 51, the upper spin shaft 52 and the support arm 54. A discharge port 53a is provided in a lower end part of the nozzle 53 and facing a central part of the front surface Wf of the substrate W held by the spin chuck 3.

A blocking plate rotating/driving mechanism 55 (FIG. 5) including an electric motor and the like is coupled to the blocking plate 51. The blocking plate rotating/driving mechanism 55 rotates the blocking plate 51 and the upper spin shaft 52 about the axis of rotation C1 with respect to the support arm 54 in response to a rotation command from the controller 4. Further, a blocking plate elevating/driving mechanism 56 is coupled to the support arm 54. The blocking plate elevating/driving mechanism 56 integrally moves the blocking plate 51, the upper spin shaft 52 and the nozzle 53 upward and downward in a vertical direction Z in response to an elevation command from the controller 4. More specifically, the blocking plate elevating/driving mechanism 56 moves the blocking plate 51, the upper spin shaft 52 and the nozzle 53 upward and downward between a blocking position (position shown in FIG. 2) where the substrate facing surface 51a is proximate to the front surface Wf of the substrate W held by the spin chuck 3 to substantially block a space above the front surface Wf from a surrounding atmosphere and a retracted position (not shown) retracted largely upward from the blocking position.

An upper end part of the nozzle 53 is connected to a processing liquid supply controller 61, a DIW supply controller 62 and a gas supply controller 63.

The processing liquid supply controller 61 includes a processing liquid pipe 611 connected to the nozzle 53 and a valve 612 disposed in the processing liquid pipe 611. The processing liquid pipe 611 is connected to a processing liquid supplier 400 functioning as a supply source of the substrate processing liquid.

Figure 6:
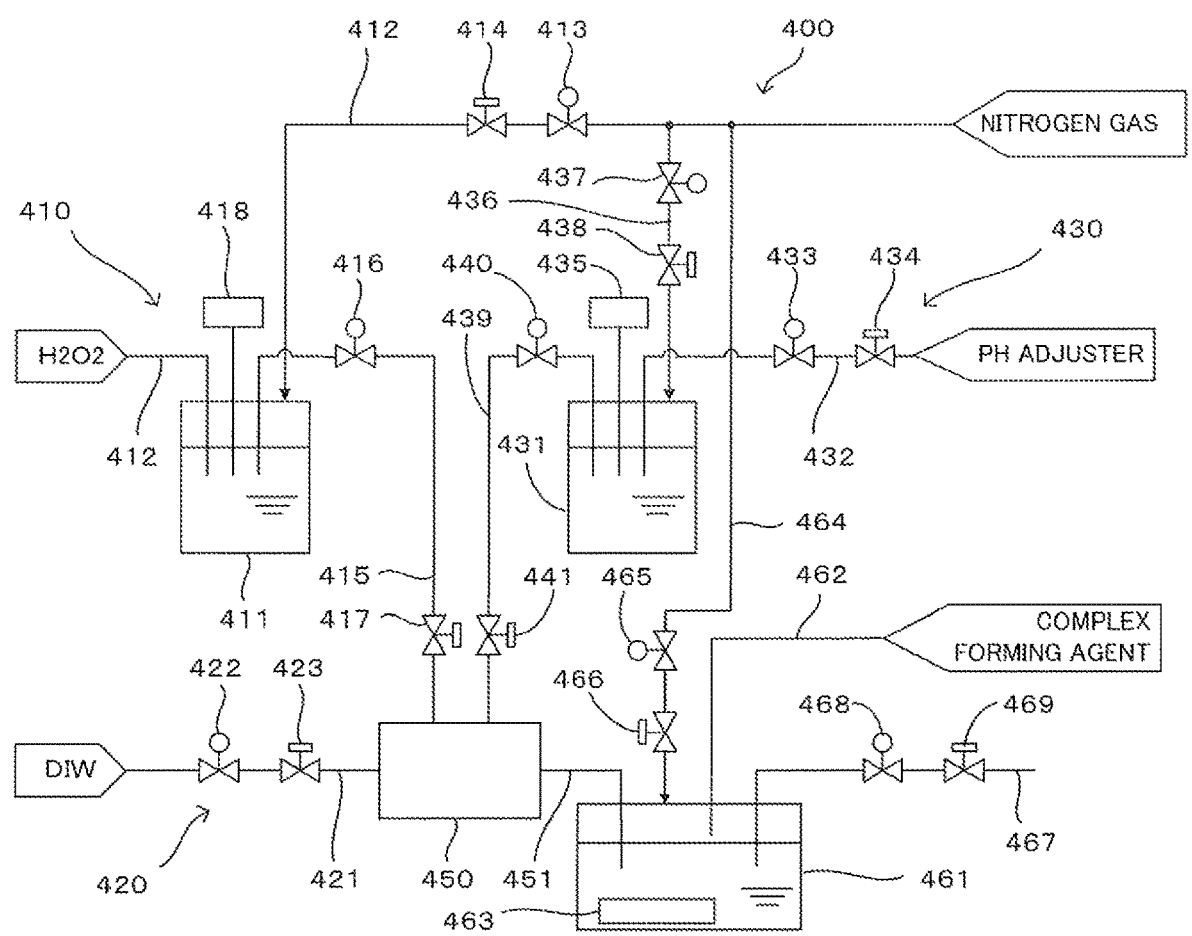
FIG. 6 is a diagram showing the configuration of the processing liquid supplier.

FIG. 6 is a diagram showing the configuration of the processing liquid supplier. The processing liquid supplier 400 includes a chemical liquid supply system 410 for supplying the hydrogen peroxide aqueous solution (chemical liquid) containing the etchant, a DIW supply system 420 for supplying the DIW and an adjuster supply system 430 for supplying the pH adjuster. The chemical liquid supply system 410 has a function of temporarily storing the hydrogen peroxide aqueous solution replenished from a supply source of the hydrogen peroxide aqueous solution in a tank 411 and supplying the hydrogen peroxide aqueous solution at a suitable timing to a mixing valve 450. The chemical liquid supply system 410 includes a pipe 412 connecting the tank 411 and a nitrogen gas supply source. A flow regulator valve 413 and an on-off control valve 414 are disposed in this pipe 412. Thus, a nitrogen gas is fed under pressure at an approximate flow rate to the tank 411 via the flow regulator valve 413 and the on-off control valve 414 by the flow regulator valve 413 and the on-off control valve 414 operating in response to a command from the controller 4 (FIG. 5), and the hydrogen peroxide aqueous solution stored in the tank 411 can be supplied to the mixing valve 450 via a pipe 415. Further, a flow regulator valve 416 and an on-off control valve 417 are disposed in the pipe 415. Thus, the hydrogen peroxide aqueous solution is supplied at a suitable timing to the mixing valve 450 by the flow regulator valve 416 and the on-off control valve 417 operating in response to a command from the controller 4. On the other hand, a sensor 418 for detecting a liquid level of the hydrogen peroxide aqueous solution in the tank 414 is provided to keep the amount of the hydrogen peroxide aqueous solution stored in the tank 411 at a specified level or higher. The sensor 418 detects the liquid level, and the hydrogen peroxide aqueous solution is replenished into the tank 411 from the supply source based on that detection result.

The DIW supply system 420 includes a pipe 421 connecting the DIW supply source and the mixing valve 450, and a flow regulator valve 422 and the on-off control valve 423 are disposed in the pipe 421. Thus, the flow regulator valve 422 and the on-off control valve 423 operate in response to a command from the controller 4 and the DIW is supplied at an appropriate flow rate at a suitable timing to the mixing valve 450.

The adjuster supply system 430 has a function of temporarily storing the pH adjuster replenished from a pH adjuster supply source to a tank 431 for pH adjustment and supplying the pH adjuster to the mixing valve 450 at a suitable timing. The adjuster supply system 430 includes a pipe 432 connecting the tank 431 and the pH adjuster supply source. A flow regulator valve 433 and an on-off control valve 434 are disposed in this pipe 432. Further, a sensor 435 for detecting a liquid level of the pH adjuster in the tank 431 is provided to keep the amount of the pH adjuster stored in the tank 431 at a specified level or higher. The sensor 435 detects the liquid level, and the pH adjuster is replenished into the tank 431 from the pH adjuster supply source by the operation of the flow regulator valve 433 and the on-off control valve 434 based on that detection result.

The tank 431 and the nitrogen gas supply source are connected by a pipe 436. A flow regulator valve 437 and an on-off control valve 438 are disposed in this pipe 436. Thus, the nitrogen gas is fed under pressure at an approximate flow rate via the flow regulator valve 437 and the on-off control valve 438 by the flow regulator valve 437 and the on-off control valve 438 operating in response to a command from the controller 4, and the pH adjuster stored in the tank 431 can be supplied to the mixing valve 450 via a pipe 439. A flow regulator valve 440 and an on-off control valve 441 are disposed in this pipe 439. Thus, the pH adjuster is supplied at an approximate flow rate at a suitable timing to the mixing valve 450 by the flow regulator valve 440 and the on-off control valve 441 operating in response to a command from the controller 4.

Appropriate amounts of the hydrogen peroxide aqueous solution, the DIW and the pH adjuster are supplied to the mixing valve 450 and mixed in the mixing valve 450. Thereafter, the mixture liquid is fed to another tank 461 via a pipe 451. This tank 461 is connected to a complex forming agent supply source via a pipe 462 and receives the supply of the complex forming agent, and the substrate processing liquid having a desire composition is produced in the tank 461. Here, ammonium chloride as an example of the complex forming agent is solid powder at a normal temperature. Accordingly, as shown in FIG. 6, a stirring unit 463 is provided in the tank 461, and the dissolution and mixing of ammonium chloride are promoted by stirring.

Further, the tank 461 is connected to the nitrogen gas supply source via a pipe 464. Further, a flow regulator valve 465 and an on-off control valve 466 are disposed in this pipe 464. Thus, the nitrogen gas is fed under pressure at an approximate flow rate to the tank 461 via the flow regulator valve 465 and the on-off control valve 466 by the flow regulator valve 465 and the on-off control valve 466 operating in response to a command from the controller 4, and the substrate processing liquid mixed in the tank 461 is fed via a pipe 467. Note that a flow regulator valve 468 and an on-off control valve 469 are disposed also in this pipe 467, and the substrate processing liquid can be supplied at an approximate flow rate at a suitable timing to the nozzle 53.

Referring back to FIG. 4, the description is continued. The DIW supply controller 62 includes a DIW supply pipe 621 connected to the nozzle 53 and a valve 622 for opening and closing the DIW supply pipe 621. The DIW supply pipe 621 is connected to the DIW supply source. If the valve 622 is opened in response to an opening/closing command from the controller 4, the DIW is supplied as a rinsing liquid to the nozzle 53 and discharged toward a central part of the surface of the substrate W from a discharge port 53a.

The gas supply controller 63 includes a gas support pipe 631 connected to the nozzle 53 and a valve 632 for opening and closing the gas support pipe 631. The gas support pipe 631 is connected to the gas supply source. In this embodiment, a dehumidified nitrogen gas is used as a gas. If the valve 632 is opened in response to an opening/closing command from the controller 4, the nitrogen gas is supplied to the nozzle 53 and blown toward the central part of the surface of the substrate W from the discharge port 53a. Note that an inert gas such as a dehumidified argon gas may be used as the gas besides the nitrogen gas.

In the processing unit 1, an exhaust tub 80 is provided to surround the spin chuck 3. Further, a plurality of cups 81, 82 (first cup 81 and second cup 82) are arranged between the spin chuck 3 and the exhaust tube 80 and a plurality of guards 84 to 86 (first guard 84 to third guard 86) are provided to receive the processing liquid scattering around the substrate W. Further, guard elevation drive mechanisms 87 to 89 (first to third guard elevation drive mechanisms 87 to 89) are respectively coupled to the guards 84 to 86. The guard elevation drive mechanisms 87 to 89 respectively independently elevate and lower the guards 84 to 86 in response to elevation commands from the controller 4. Note that the first guard elevation drive mechanism 87 is not shown in FIG. 4.

The controller 4 includes an arithmetic unit such as a CPU, a storage unit such as a fixed memory device or a hard disk drive and an input/output unit. A program to be executed by the arithmetic unit is stored in the storage unit. The controller 4 controls each component of the apparatus in accordance with the program, thereby performing a substrate processing shown in FIG. 8 using the substrate processing liquid containing not only the etchant, but also a migration promoter.

Figure 7:
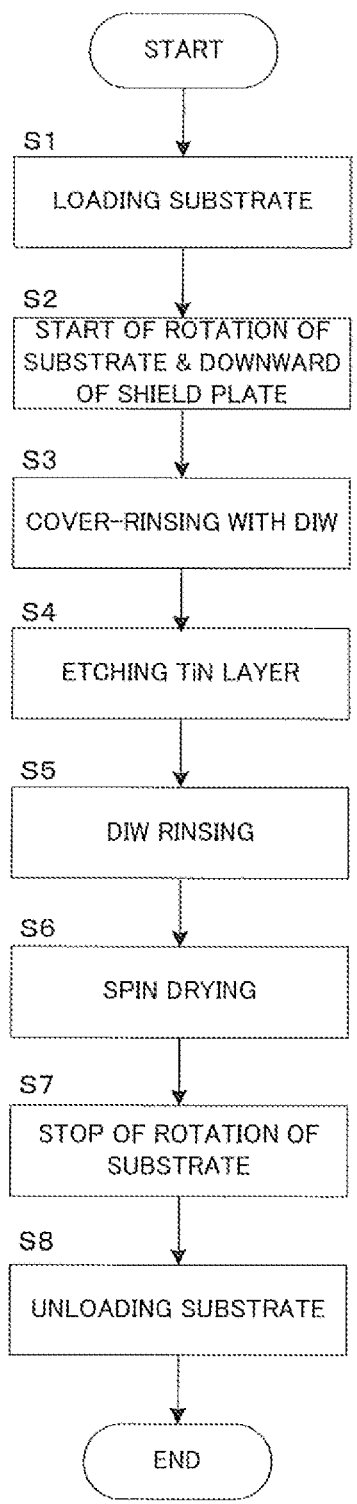
FIG. 7 is a flow chart showing contents of the substrate processing performed in the substrate processing apparatus of FIG. 2.

FIG. 7 is a flow chart showing contents of the substrate processing performed in the substrate processing apparatus of FIG. 2. An object to be processed in the substrate processing apparatus 100 is, for example, the substrate W for manufacturing the FinFET as shown in the upper stage of FIG. 1, and the TiN layer 12a for the HKMG layer is formed to straddle over the plurality of fins F in the substrate W.

Before the unprocessed substrate W is loaded into the processing unit 1, the controller 4 gives a command to each component of the apparatus to set the processing unit 1 in an initial state. Specifically, the shutter 23 (FIGS. 2 and 3) is closed by the shutter opening/closing mechanism 22. The spin chuck 3 is positioned and stopped at a position suitable for the loading of the substrate W by the substrate rotation drive mechanism 34, and the chuck pins 31 are set in an open state by an unillustrated chuck opening/closing mechanism. The shield plate 51 is positioned at the retracted position by the shield plate elevation drive mechanism 56, and the rotation of the shield plate 51 is stopped by the shield plate rotation drive mechanism 55. Any of the guards 84 to 86 is moved down and positioned. Further, any of the valves 612, 622 and 632 is closed.

If the unprocessed substrate W is conveyed by the substrate conveyor robot 111, the shutter 23 is opened. As the shutter 23 is opened, the substrate W is loaded into the internal space 21 of the chamber 2 by the substrate conveyor robot 111 and transferred to the spin chuck 3 with the surface Wf facing upward. Then, the chuck pins 31 are set in a closed state and the substrate W is held by the spin chuck 3 (Step S1, substrate loading).

Following the loading of the substrate W, the substrate conveyor robot 111 is retracted to the outside of the chamber 2. Further, after the shutter 23 is closed again, the controller 4 increases the rotation speed (number of revolutions) of the spin chuck 3 to a predetermined processing speed (in a range of about 10 to 3000 rpm, e.g. 800 to 1200 rpm) by controlling the motor of the substrate rotation drive mechanism 34 and maintains that processing speed. Further, the controller 4 lowers the shield plate 51 from the retracted position and arranges the shield plate 51 at the shielding position by controlling the shield plate elevation drive mechanism 56 (Step S2). Further, the controller 4 elevates the first to third guards 84 to 86 to upper positions by controlling the guard elevation drive mechanisms 87 to 89, thereby causing the first guard 84 to face a peripheral end surface of the substrate W.

When the rotation of the substrate W reaches the processing speed, the controller 4 subsequently opens the valve 622. In this way, the DIW is discharged from the discharge port 53a of the nozzle 53 and supplied to the surface Wf of the substrate W. On the surface Wf of the substrate W, the DIW moves to a peripheral edge part of the substrate W by being subjected to a centrifugal force by the rotation of the substrate W. In this way, a so-called cover-rinsing process of covering the entire surface Wf of the substrate W with the DIW is performed (Step S3). Note that the cover rinsing is not essential and an etching process (Step S4) to be described next may be immediately performed without performing the cover rinsing.

In Step S4, the controller 4 closes the valve 612 and opens the valve 622. In this way, the liquid discharged from the discharge port 53a of the nozzle 53 changes from the DIW to the substrate processing liquid and the substrate processing liquid is supplied to the surface Wf of the substrate W. On the surface Wf of the substrate W, the substrate processing liquid moves to the peripheral edge part of the substrate W by being subjected to the centrifugal force by the rotation of the substrate W. In this way, the entire surface Wf of the substrate W is subjected to the etching process by the substrate processing liquid. At this time, the substrate processing liquid contains ammonium chloride as the complex forming agent together with the etchant for the TiN layer 12a. Further, the pH of the substrate processing liquid is adjusted approximately to 9 by adding ammonium hydroxide as the pH adjuster.

The etching process by the substrate processing liquid is continued for a predetermined etching time, and the substrate processing liquid discharged from the peripheral edge part of the substrate W during that time is received by the inner wall of the first guard 84 and fed to a waste liquid treatment facility outside the apparatus along an unillustrated waste liquid path. Upon the elapse of the etching time, the controller 4 closes the valve 612 to stop the discharge of the substrate processing liquid from the nozzle 53.

Following the etching process, a rinsing process by the rinsing liquid (DIW) is performed (Step S5). In this DIW rinsing, the controller 4 opens the valve 622 while maintaining the positions of the first to third guards 84 to 86. In this way, the DIW is supplied as the rinsing liquid to the central part of the surface Wf of the substrate W subjected to the etching process from the discharge port 53a of the nozzle 53. Then, the DIW moves to the peripheral edge part of the substrate W by being subjected to the centrifugal force by the rotation of the substrate W. In this way, the substrate processing liquid adhering onto the substrate W is washed away by the DIW and the etching by the substrate processing liquid is stopped. At this time, the DIW discharged from the peripheral edge part of the substrate W is discharged laterally of the substrate W from the peripheral edge part of the substrate W and fed to the waste liquid treatment facility outside the apparatus similarly to the substrate processing liquid. This DIW rinsing is continued for a predetermined rinsing time. Upon the elapse of the rinsing time, the controller 4 closes the valve 622 to stop the discharge of the DIW from the nozzle 53.

After the DIW rinsing is completed, the controller 4 performs spin drying by increasing the number of revolutions of the substrate W (Step S6). In this embodiment, in parallel with the spin drying, the controller 4 opens the valve 632 to blow the dry nitrogen gas from the nozzle 53 to the surface Wf of the substrate W being spin-dried. In this way, the drying of the substrate W is promoted.

After the spin drying is continued for a predetermined time, the controller 4 stops the rotation of the spin chuck 3 by controlling the motor of the substrate rotation drive mechanism 34 and stops the blowing of the nitrogen gas by closing the valve 632 (Step S7). Further, the controller 4 stops the rotation of the shield plate 51 by controlling the shield plate rotation drive mechanism 55 and elevates the shield plate 51 from the shielding position and positions the shield plate 51 at the retracted position by controlling the shield plate elevation drive mechanism 56. Furthermore, the controller 4 lowers the third guard 86 by controlling the third guard elevation drive mechanism 89, whereby all the guards 86 to 88 are retracted downward from the peripheral end surface of the substrate W.

Thereafter, after the controller 4 opens the shutter 23 (FIGS. 2 and 3) by controlling the shutter opening/closing mechanism 22, the substrate conveyor robot 111 enters the internal space of the chamber 2 and unloads the processed substrate W released from holding by the chuck pins 31 to the outside of the chamber 2 (Step S8). Note that if the unloading of the substrate W is completed and the substrate conveyor robot 111 is separated from the processing unit 1, the controller 4 closes the shutter 23 by controlling the shutter opening/closing mechanism 22.

As described above, in this embodiment, the TiN layer 12a is etched (Step S4) using the substrate processing liquid. Thus, the etchant efficiently infiltrates into the inside of the trench structure, i.e. the narrow spaces 12f. Thus, the TiN layer 12a (etched layer) constituting the bottom walls 12d and the side walls 12e are etched at an excellent etching rate. Further, exposed regions of the TiN layer 12a are also satisfactorily etched by the substrate processing liquid. As a result, the metal layer 12 having desired shape and thickness can be formed as shown in the lower stage of FIG. 1.

As described above, in this embodiment, Ti and TiN respectively correspond to examples of a "metal" and a "metal compound" of the invention. Further, the HKMG layer 13 and the TiN layer 12a respectively correspond to examples of a "high-k metal gate layer" and a "surface layer of the high-k metal gate layer" of the invention. Further, the opening dimension OW of the TiN layer 12a corresponds to a "narrow width" of the invention.

Note that the invention is not limited to the embodiment described above and various changes other than the aforementioned ones can be made without departing from the gist of the invention. For example, since ammonium chloride used as the complex forming agent is solid powder at a normal temperature, the stirring unit 463 is arranged in the tank 461 in the above embodiment. Ammonium chloride may be dissolved into a small amount of the DIW to prepare an ammonium chloride aqueous solution, and this ammonium chloride aqueous solution may be fed to the tank 461 to be mixed therein.

Further, although the substrate processing liquid is produced immediately before supply to the substrate W and is supplied to the substrate W from the nozzle 53 for the etching process in the above embodiment, the substrate processing liquid may pass through a heater before supply to be adjusted to a temperature suitable for the etching process.

Further, although the invention is applied to the so-called single-wafer type substrate processing apparatus 100 for performing the etching process by supplying the substrate processing liquid to the substrate W held by the spin chuck 3 in the above embodiment, the invention may be applied to a so-called batch-type substrate processing apparatus. That is, the etching process may be performed for a plurality of substrates W held by a substrate holder by immersing the substrate holder holding the substrates W into the substrate processing liquid stored in a processing bath.

Further, although the pH of the substrate processing liquid is adjusted by the pH adjuster in the above embodiment, a substrate processing liquid obtained by mixing a complex forming agent into a mixture liquid (having a pH of 5 or more) having no pH adjuster added thereto as described later may be used. "Example 1" to be described later is an example of such a substrate processing liquid.

Further, the etching process may be performed by directly supplying the mixture liquid (=chemical liquid+DIW (+pH adjuster)) and the complex forming agent to the substrate W instead of supplying the substrate processing liquid to the substrate W.

Further, although the TiN layer is etched as an example of the "etched layer" of the invention in the above embodiment, the invention can be applied also to a substrate processing technique and a substrate processing liquid for etching another metal layer (MG) used in a gate of a FinFET.

Further, although the substrate in which the bottom wall 12$d$ and the two side walls 12$e$ constituting the trench structure as shown in FIG. 1 serves as the etched layer is a substrate to be processed in the above embodiment, an application object of the invention is not limited to this. For example, the invention is applicable to a substrate in which one of two side walls 12$e$ and a bottom wall 12$d$ serves as an etched layer. Further, the invention is applicable to a substrate in which a side wall 12$e$ serves as an etched layer having a tubular shape. Furthermore, the invention is applicable to a substrate in which only a bottom wall 12$d$ serves as an etched layer. For example, a substrate processing technique for etching a substrate having a laminated structure in which a thin metal layer or metal compound layer is sandwiched by layers having a different composition (silicon layer, silicon oxide layer and the like) as described in Examples to be described next is also included in the application object of the invention. A substrate for manufacturing a 3D-NAND memory is an example of the substrate having such a laminated structure and requiring the etching of the thin metal layer or metal compound layer.

Further, the composition of the substrate processing liquid is not limited to the aforementioned one and complex forming agents and pH adjusters described in the above "Summary of Invention" can be used. Note that specific examples and effects of those are described in detail in the following Examples.

EXAMPLES

Preferred modes of the invention are specifically described with reference to Examples below. However, the invention is not limited by the following Examples. Thus, it is, of course, possible to carry out the invention by making appropriate changes within a range adaptable to the gist described above and below, and those changes are also included in the technical scope of the invention.

Here, samples shown in FIG. 8 were prepared and the following experiment was conducted to evaluate an etching rate in narrow parts and non-narrow parts.

FIG. 8 is a diagram schematically showing the configuration of an evaluation sample for the etching rate and experiment contents. In a substrate Wa shown in a row (a) of FIG. 8, a TiN layer W2 is formed on the upper surface of a silicon base material W1. Further, a polysilicon layer W3 is laminated on the TiN layer W2. A plurality of through holes W4 having an inner diameter of 60 nm are, for example, provided in this polysilicon layer W3. If a substrate processing liquid containing the etchant is supplied to the surface of the substrate Wa thus configured, the substrate processing liquid is supplied to the TiN layer W2 via the through holes W4, exposed regions W5 facing the through holes W4, out of the TiN layer W2, are etched by the etchant contained in the substrate processing liquid, the etchant infiltrates into narrow spaces W7 sandwiched between the silicon base material W1 and the polysilicon layer W3 via openings W6 (i.e. gap parts between the silicon base material W1 and the polysilicon layer W3) with the lapse of time. In this way, the etching of the narrow spaces W7 progresses.

If a size (equivalent to a thickness THa of the TiN layer W2) of the openings W6 is relatively large, an etching rate substantially equal to the one obtained when the substrate processing liquid is supplied to a substrate Wb in which the TiN layer W2 is formed in a blanket manner on the upper surface of the silicon base material W1 as shown in a row (b) of FIG. 8, e.g. formed to have a thickness THb of about 500 nm to proceed with the etching is obtained. For example, if EMa, EMb denote etched amounts until a certain time elapses after a chemical liquid is supplied to the substrates Wa, Wb, WMa≈EMb.

If (EMa/EMb) is defined as a blanket ratio of the substrate Wa, it becomes difficult to infiltrate the etchant into the narrow spaces W7 as in the case of the narrow opening dimension OW in the upper stage of FIG. 1 if the thickness THa of the TiN layer W2 in the substrate Wa becomes thin. Thus, the etching rate becomes smaller and the blanket ratio of the substrate Wa decreases from "1". Accordingly, in this embodiment, the substrates Wa having THa of 2 nm, 5 nm and 10 nm and the substrates Wb were prepared and five kinds of substrate processing liquids were prepared.

As shown in Table 1, these substrate processing liquids are:

(1) Substrate processing liquid obtained by adding 1 mM of ammonium chloride as a complex forming agent to a mixture liquid obtained by mixing a hydrogen peroxide aqueous solution and DIW at a ratio of 1:5 and adjusting a $NH_4^+$ ion concentration to 1 m mon (pH is approximately 5);

(2) Substrate processing liquid obtained by adding 10 mM of ammonium chloride as a complex forming agent to a mixture liquid obtained by mixing a hydrogen peroxide aqueous solution and DIW at a ratio of 1:5 and adjusting a $NH_4^+$ ion concentration to 10 m mol/L (pH is approximately 5);

(3) Substrate processing liquid obtained by adding 100 mM of ammonium chloride as a complex forming agent to a mixture liquid obtained by mixing a hydrogen peroxide aqueous solution and DIW at a ratio of 1:5 and adjusting a $NH_4^+$ ion concentration to 100 m mol/L (pH is approximately 5);

(4) Substrate processing liquid obtained by mixing a hydrogen peroxide aqueous solution and DIW at a ratio of 1:5 (pH is approximately 5); and (5) Substrate processing liquid obtained by mixing a hydrogen peroxide aqueous solution, a chloric acid as a pH adjuster and DIW at a ratio of 1:1:5 (pH is less than 1).

Etching rates (ER (nm/min)) in the narrow spaces W7 were obtained by supplying each substrate processing liquid to the substrates Wa, Wb and measuring etched amounts for 1 min, i.e. etching amounts EMa, EMb. Further, (EMa/EMb) is a blanket ratio (BL ratio) of the substrate Wa. Those results are compiled into Table 1. The blanket ratios in relation to the value of the thickness THa equivalent to the opening dimension OW of the TiN layer 12$a$ shown in FIG. 1 are plotted in FIG. 9. Note that these point also apply to Table 2 and FIG. 10 to be described later.

TABLE 1

| | Substrate Processing Liquid | | | | NH4+ ion Concentration (m mol/L) | Blanket ER (nm/min) | 2 nm TiN | | 5 nm TiN | | 10 nm TiN | |
|---|---|---|---|---|---|---|---|---|---|---|---|---|
| | Chemical Liquid | pH Adjuster | DIW | Complex Forming Agent | pH | | | ER (nm/min) | BL Ratio | ER (nm/min) | BL Ratio | ER (nm/min) | BL Ratio |
| EX1 | H2O2 (1) | | DIW (5) | NH4Cl (1 mM) | ≈5 | 1 | 5.4 | 2.14 | 0.396 | 4.6 | 0.852 | 6.26 | 1.159 |
| EX2 | H2O2 (1) | | DIW (5) | NH4Cl (10 mM) | ≈5 | 10 | 5.4 | 2.29 | 0.424 | 4.55 | 0.843 | 5.61 | 1.039 |
| EX3 | H2O2 (1) | | DIW (5) | NH4Cl (100 mM) | ≈5 | 100 | 4 | 2.19 | 0.548 | 4.7 | 1.175 | 5.94 | 1.485 |
| C. EX1 | H2O2 (1) | | DIW (5) | | ≈5 | | 7.7 | 2.2 | 0.286 | 5.56 | 0.722 | 6.73 | 0.874 |
| C. EX2 | H2O2 (1) | HCl (1) | DIW (5) | | <1 | | 6.6 | 1.19 | 0.180 | 2.61 | 0.395 | 3.81 | 0.577 |

Figure 9:
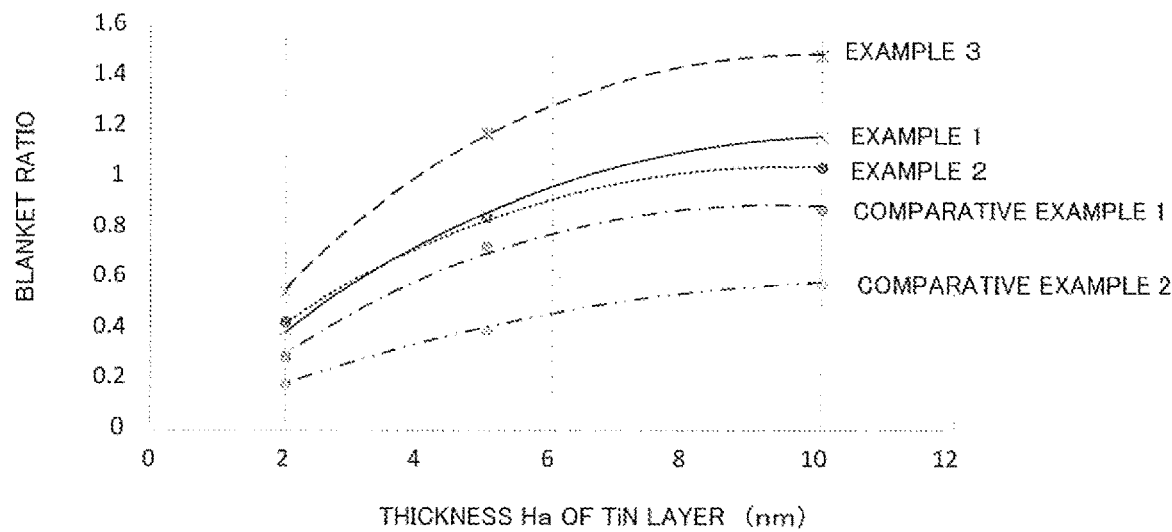
FIG. 9 is a graph showing the etching characteristics of Example 1.

As is clear from Table 1 and FIG. 9, in the case of performing the etching using the substrate processing liquid (5) having a low pH, the etching rate in the narrow spaces W7 decreases due to a reduction of an etchant concentration (Comparative Example 2). Further, the etching rate is improved by performing the etching using the substrate processing liquid (4) having a higher pH than the substrate processing liquid (5) as shown in Comparative Example 1, but the etching rate in the narrow spaces W7 is still low and the blanket ratio in the narrow parts is largely reduced.

In contrast, in the case of performing the etching using the substrate processing liquids (1), (2) and (3) having the complex forming agent added thereto, the etching rate in the narrow spaces W7 is largely improved (Examples 1 to 3). By using the substrate processing liquids (1) to (3) in this way, the etchant can be efficiently infiltrated into the narrow spaces W7 and the TiN layer W2 facing the narrow spaces W7 can be etched at an excellent etching rate.

Further, as is understood from the comparison of Examples 1 to 3, if the ion concentration of the complex forming agent contained in the substrate processing liquid exceeds 10 m mol/L due to the addition of the complex forming agent (ammonium chloride), the blanket ratio (BL ratio) increases. However, a change amount of the blanket ratio associated with a size change of the narrow spaces W7 increases and it becomes difficult to control the progress of the etching in the narrow spaces W7. On the other hand, the above change amount is suppressed and the progress of the etching can be satisfactorily controlled by suppressing the ion concentration of the complex forming agent to or below 10 m mol/L. However, if the ion concentration of the complex forming agent is low as in Example 1, the change amount of the blanket ratio tends to increase. Thus, to obtain a stable etching rate regardless of the size of the narrow spaces W7, the ion concentration of the complex forming agent is desirably adjusted to 1 m mol/L or more and 10 m mol/L or less, and more preferably to 10 m mol/L.

Further, five kinds of substrate processing liquids having ammonium chloride added as a pH adjuster were prepared and an experiment similar to the above one was conducted. As shown in Table 2, these substrate processing liquids are:

(6) Substrate processing liquid obtained by adding 1 mM of ammonium chloride as a complex forming agent to a mixture liquid obtained by mixing a hydrogen peroxide aqueous solution, ammonium hydroxide as a pH adjuster and DIW at a ratio of 1:0.01:5 and adjusting a $NH_4^+$ ion concentration to 1.67 m mon (pH is approximately 9);

(7) Substrate processing liquid obtained by adding 10 mM of ammonium chloride as a complex forming agent to a mixture liquid obtained by mixing a hydrogen peroxide aqueous solution, ammonium hydroxide as a pH adjuster and DIW at a ratio of 1:0.01:5 and adjusting a $NH_4^+$ ion concentration to 10.67 m mol/L (pH is approximately 9);

(8) Substrate processing liquid obtained by mixing a hydrogen peroxide aqueous solution, ammonium hydroxide as a pH adjuster and DIW at a ratio of 1:0.001:5 and adjusting a $NH_4^+$ ion concentration to 0.21 m mol/L (pH is approximately 8);

(9) Substrate processing liquid obtained by mixing a hydrogen peroxide aqueous solution, ammonium hydroxide as a pH adjuster and DIW at a ratio of 1:0.01:5 and adjusting a $NH_4^+$ ion concentration to 0.67 m mol/L (pH is approximately 9);

(10) Substrate processing liquid obtained by mixing a hydrogen peroxide aqueous solution, ammonium hydroxide as a pH adjuster and DIW at a ratio of 1:0.1:5 and adjusting a $NH_4^+$ ion concentration to 2.1 m mol/L (pH is approximately 10); and

(11) The same substrate processing liquid as the substrate processing liquid (5), i.e. obtained by mixing a hydrogen peroxide aqueous solution, a chloric acid as a pH adjuster and DIW at a ratio of 1:1:5 (pH is less than 1).

The etching rates (ER (nm/min) and the blanket ratios (BL ratios) were obtained by supplying each substrate processing liquid to the substrates Wa, Wb. Those results are compiled into Table 2 and the blanket ratios in relation to the value of the thickness THa are plotted in FIG. 10.

TABLE 2

| | Substrate Processing Liquid | | | | | NH4+ ion Concentration (m mol/L) | Blanket ER (nm/min) | 2 nm TiN | | 5 nm TiN | | 10 nm TiN | |
|---|---|---|---|---|---|---|---|---|---|---|---|---|---|
| | Chemical Liquid | pH Adjuster | DIW | Complex Forming Agent | pH | | | ER (nm/min) | BL Ratio | ER (nm/min) | BL Ratio | ER (nm/min) | BL Ratio |
| EX4 | H2O2 (1) | NH4OH (0.01) | DIW (5) | NH4Cl (1 mM) | ≈9 | 1.67 | 4.2 | 4.28 | 1.019 | 3.81 | 0.907 | 4.93 | 1.174 |
| EX5 | H2O2 (1) | NH4OH (0.01) | DIW (5) | NH4Cl (10 mM) | ≈9 | 10.67 | 4.9 | 3.28 | 0.669 | 4.06 | 0.829 | 6.07 | 1.239 |
| C. EX3 | H2O2 (1) | NH4OH (0.001) | DIW (5) | | ≈8 | 0.21 | 5.5 | 2.69 | 0.489 | 3.9 | 0.709 | 5.63 | 1.024 |
| C. EX4 | H2O2 (1) | NH4OH (0.01) | DIW (5) | | ≈9 | 0.67 | 6.3 | 3 | 0.476 | 3.87 | 0.614 | 3.65 | 0.579 |
| C. EX5 | H2O2 (1) | NH4OH (0.1) | DIW (5) | | ≈10 | 2.1 | 5.3 | 3.78 | 0.713 | 3.3 | 0.623 | 3.53 | 0.666 |
| C. EX6 | H2O2 (1) | HCl (1) | DIW (5) | | <1 | | 6.6 | 1.19 | 0.180 | 2.61 | 0.395 | 3.81 | 0.577 |

Figure 10:
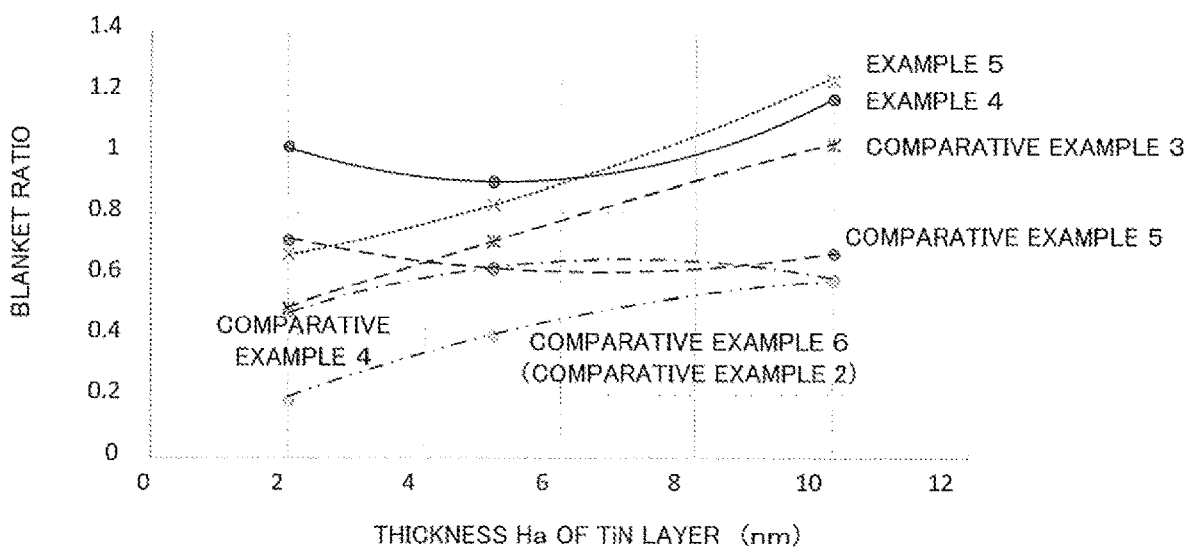
FIG. 10 is a graph showing the etching characteristics of Examples listed in Table 2.

As is clear from Table 2 and FIG. 10, by increasing the pH and performing the etching using the substrate processing liquids (9) and (10) containing $NH_4^+$ ions as shown in Comparative Examples 4 and 5, the etching rate is improved as compared to Comparative Example 6, but the etching rate in the narrow spaces W7 is still low.

In contrast, in the case of performing the etching using the substrate processing liquids (6) and (7) having a pH increased to 8 or more and having the complex forming agent added thereto, the etching rate in the narrow spaces W7 is largely improved (Examples 4 and 5). Particularly, the effect of the complex forming agent is notable from the comparison of Example 4 and Comparative Example 4. Specifically, the substrate processing liquid (6) used in Example 4 is obtained by mixing a tiny amount of the complex forming agent to the substrate processing liquid (9) used in Comparative Example 4 and increasing the ion concentration of the complex forming agent in the substrate processing liquid from 0.67 m mol/L to 1.67 m mol/L beyond 1 m mol/L, whereby the etching rate is largely improved. However, as is clear from the comparison of Examples 4 and 5, if the ion concentration increases, a change amount of the blanket ratio associated with a size change of the narrow spaces W7 increases. As a result, the controllability of the etching progress in the narrow spaces W7 is slightly reduced. On the other hand, the above change amount is suppressed and the etching progress can be satisfactorily controlled by suppressing the ion concentration of the complex forming agent to 2 m mol/L or less. Thus, in the case of adjusting the pH to 8 or more, the substrate processing liquid is desirably composed such that the ion concentration of the complex forming agent is 1 m mol/L or more and 2 m mol/L or less.

Although the invention has been described along with the specific embodiment above, this description is not intended to be interpreted in a limited sense. If the description of the invention is referred to, various modifications of the disclosed embodiment would be apparent to a person skilled in this art, similarly to other embodiments of the invention. Therefore, the appended claims are through to include these modifications or embodiments without departing from the true scope of the invention.

This invention can be applied to substrate processing liquids in general for applying an etching process to a substrate having a trench structure and substrate processing apparatuses in general for processing a substrate using the substrate processing liquid.

What is claimed is:

1. A substrate processing liquid for removing an etched layer by being supplied to a substrate having a trench structure in which a narrow space is formed by an opening having a narrow width, a bottom wall facing the opening and one or more side walls extending toward the opening and at least either the bottom wall or the side wall is formed by the etched layer made of metal or a metal compound, the liquid comprising:
   a chemical liquid containing $H_2O_2$ molecules or $HO_2^+$ functioning as an etchant for etching the metal; and
   a complex forming agent containing $NH_4^+$ and forming a complex with ions of the metal, wherein
   a pH is adjusted to a value that is equal to or more than 8 but no more than 9.

2. The substrate processing liquid according to claim 1, wherein:
   the substrate is formed with a high-k metal gate layer covering over two adjacent fins standing from a surface of the substrate while being spaced apart to form a gate of a FinFET, and
   a surface layer of the high-k metal gate layer is etched and removed as the etched layer.

3. The substrate processing liquid according to claim 2, wherein:
   the metal includes at least one kind of titanium and tantalum.

4. The substrate processing liquid according to claim 1, wherein:
   the chemical liquid is a hydrogen peroxide aqueous solution.

5. The substrate processing liquid according to claim 1, wherein:
   the complex forming agent is an ammonium salt expressed by a general formula (1):

$$(NH_4^+)_n X^{n-} \qquad (1),$$

where $X^{n-}$ denotes n-valent anions and n is 1 or 2.

6. The substrate processing liquid according to claim 1, further comprising:
   a pH adjuster for adjusting the pH, wherein:
   the pH adjuster contains at least one kind of ammonium hydroxide, sodium hydroxide and potassium hydroxide.

7. The substrate processing liquid according to claim 1, wherein:
   an ion concentration of the complex forming agent is 1 m mol/L or more and 10 m mol/L or less.

8. The substrate processing liquid according to claim 1, wherein:
   the complex forming agent is an alkyl ammonium salt expressed by a general formula (1):

   $(NR_4^+)_n X^{n-}$  (1), where $X^{n-}$ denotes n-valent anions and n is 1 or 2.

9. A substrate processing method, comprising:
   removing an etched layer by supplying a substrate processing liquid to a substrate having a trench structure in which a narrow space is formed by an opening having a narrow width, a bottom wall facing the opening and one or more side walls extending toward the opening and at least either the bottom wall or the side wall is formed by the etched layer made of metal or a metal compound; and
   stopping the removal of the etched layer by removing the substrate processing liquid from the substrate, wherein:
   the substrate processing liquid includes a chemical liquid containing $H_2O_2$ molecules or $HO_2^-$ functioning as an etchant for etching the metal and a complex forming agent containing $NH_4^+$ and forming a complex with ions of the metal; and
      the substrate processing liquid is adjusted to a pH value that is equal to or more than 8 but no more than 9.

10. The substrate processing method according to claim 9, wherein:
    an ion concentration of the complex forming agent of the substrate processing liquid is 1 m mol/L or more and 10 m mol/L or less.

11. A substrate processing apparatus, comprising:
    a substrate holder that holds a substrate having a trench structure in which a narrow space is formed by an opening having a narrow width, a bottom wall facing the opening and one or more side walls extending toward the opening and at least either the bottom wall or the side wall is formed by an etched layer made of metal or a metal compound; and
    a processing liquid supplier that supplies a substrate processing liquid to the substrate held by the substrate holder, wherein:
    the substrate processing liquid includes a chemical liquid containing $H_2O_2$ molecules or $HO_2^-$ functioning as an etchant for etching the metal and a complex forming agent containing $NH_4^+$ and forming a complex with ions of the metal; and
       the substrate processing liquid is adjusted to a pH value that is equal to or more than 8 but no more than 9.

12. The substrate processing apparatus according to claim 11, wherein:
    an ion concentration of the complex forming agent of the substrate processing liquid is 1 m mol/L or more and 10 m mol/L or less.

13. The substrate processing apparatus according to claim 11, wherein:
    the substrate processing liquid is adjusted to a pH of 8 or more, and
    an ion concentration of the complex forming agent of the substrate processing liquid is 1 m mol/L or more and 2 m mol/L or less.

\* \* \* \* \*